(12) United States Patent
Jung et al.

(10) Patent No.: US 9,960,293 B2
(45) Date of Patent: May 1, 2018

(54) METHOD FOR MANUFACTURING A TRANSPARENT CONDUCTIVE ELECTRODE USING CARBON NANOTUBE FILMS

(75) Inventors: Hee-Tae Jung, Daejeon (KR); Byung-Seon Kong, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days. days.

(21) Appl. No.: 12/306,849

(22) PCT Filed: Jan. 22, 2007

(86) PCT No.: PCT/KR2007/000370
§ 371 (c)(1),
(2), (4) Date: Jun. 18, 2009

(87) PCT Pub. No.: WO2008/001998
PCT Pub. Date: Jan. 3, 2008

(65) Prior Publication Data
US 2009/0266580 A1  Oct. 29, 2009

(30) Foreign Application Priority Data
Jun. 29, 2006 (KR) ........................ 10-2006-0059702

(51) Int. Cl.
*H01L 31/00* (2006.01)
*H01L 31/0224* (2006.01)
(Continued)

(52) U.S. Cl.
CPC ...... *H01L 31/022466* (2013.01); *B82Y 10/00* (2013.01); *B82Y 30/00* (2013.01);
(Continued)

(58) Field of Classification Search
CPC ............................................. H01L 31/022466
(Continued)

(56) References Cited

U.S. PATENT DOCUMENTS

2002/0136683 A1* 9/2002 Smalley et al. ............... 423/461
2002/0172639 A1* 11/2002 Horiuchi et al. ........... 423/447.2
(Continued)

FOREIGN PATENT DOCUMENTS

| KR | 1020050001589 A | 1/2005 |
| KR | 1020050080960 A | 8/2005 |
| KR | 100685796 B1 | 2/2007 |

OTHER PUBLICATIONS

Lordi et al., "Method for Supporting Platinum on Single-Walled Carbon Nanotubes for a Selective Hydrogenation Catalyst," 2001, Chem. Mater. 13, 733-737.*
(Continued)

*Primary Examiner* — Robert A Vetere
(74) *Attorney, Agent, or Firm* — Rabin & Berdo, P.C.

(57) ABSTRACT

The present invention relates to a method for preparing a transparent electrode using a carbon nanotube (CNT) film, and more particularly, to a method for preparing a transparent electrode, the method comprising the steps of forming a CNT film on a desired substrate using a dispersed solution of CNT and then reducing/forming metal nanoparticles on the surface of the CNT film. According to the present invention, a transparent electrode in which gold nanoparticles are formed on the surface of high density CNT film having high purity, can be prepared. The inventive transparent electrode has high visible ray penetration and an excellent electrical conductivity by hyperfine metal particles uniformly formed on the surface thereof as well as a uniform increase in electrical conductivity over the whole CNT film, and thus it can be applied to various displays as well as image sensors, solar cells, touch panels, digital papers, electromagnetic shielding agents, static charge preventing agents and the like.

7 Claims, 3 Drawing Sheets

(51) Int. Cl.

| | |
|---|---|
| *B82Y 10/00* | (2011.01) |
| *B82Y 30/00* | (2011.01) |
| *H01B 1/02* | (2006.01) |
| *H01B 1/04* | (2006.01) |
| *H01L 31/18* | (2006.01) |
| *H05B 33/28* | (2006.01) |
| *H01L 51/44* | (2006.01) |
| *H01L 51/52* | (2006.01) |

(52) U.S. Cl.
CPC ................. *H01B 1/02* (2013.01); *H01B 1/04* (2013.01); *H01L 31/1884* (2013.01); *H05B 33/28* (2013.01); *H01L 51/444* (2013.01); *H01L 51/5203* (2013.01); *H01L 2224/13562* (2013.01); *H01L 2924/12044* (2013.01); *Y02E 10/50* (2013.01)

(58) Field of Classification Search
USPC ....................................................... 427/229
See application file for complete search history.

(56) References Cited

U.S. PATENT DOCUMENTS

| | | | | |
|---|---|---|---|---|
| 2002/0179434 | A1* | 12/2002 | Dai et al. ...................... | 204/242 |
| 2003/0193288 | A1* | 10/2003 | Pavlovsky ................... | 313/506 |
| 2004/0241896 | A1* | 12/2004 | Zhou ...................... | B05D 1/185 |
| | | | | 438/48 |
| 2005/0019791 | A1* | 1/2005 | Jung et al. ......... | 435/6 |
| 2006/0054868 | A1* | 3/2006 | Dai et al. ...................... | 252/500 |
| 2007/0041887 | A1* | 2/2007 | Veedu ................... | B82Y 30/00 |
| | | | | 423/447.2 |
| 2007/0120095 | A1* | 5/2007 | Gruner ................... | B82Y 10/00 |
| | | | | 252/500 |

OTHER PUBLICATIONS

Satishkumar et al., "The decoration of carbon nanotubes by metal nanoparticles," 1996, J. Phys. D. 29, 3173-3176.*

Kim et al., "Hole-Doped Single-Walled Carbon Nanotubes: Ornamenting with Gold Nanoparticles in Water", Nov. 2005, Angew. Chem. Int. Ed., 45, pp. 104-107.*

\* cited by examiner

METHOD FOR MANUFACTURING A TRANSPARENT CONDUCTIVE ELECTRODE USING CARBON NANOTUBE FILMS

CROSS-REFERENCE TO RELATED APPLICATIONS

This application is filed under the provisions of 35 U.S.C. § 371 and claims the priority of International Patent Application No. PCT/KR2007/000370 filed on 22 Jan. 2007 entitled "Method for Manufacturing a Transparent Conductive Electrode Using Carbon Nanotube Films" in the name of Hee-Tae JUNG, et al., which claims priority of Korean Patent Application No. 10-2006-0059702 filed on 29 Jun. 2006, both of which are hereby incorporated by reference herein in their entirety.

TECHNICAL FIELD

The present invention relates to a method for preparing a transparent electrode using a carbon nanotube (CNT) film, and more particularly, to a method for preparing a transparent electrode, the method comprising the steps of forming a CNT film on a substrate using a dispersed solution of CNT and then reducing/forming metal nanoparticles on the surface of the CNT film.

BACKGROUND ART

A transparent conductive thin film is a material widely used for devices such as image sensors, solar cells, various displays (PDP, LCD) and the like, which need to have light penetration and conductivity. Indium tin oxide (ITO) has been studied as a generally flexible transparent electrode for displaying, but ITO has disadvantages, in that it causes expansive processing costs since a vacuum process environment is basically required for manufacturing ITO thin film and its life span is shortened due to ITO thin film being broken off when displaying devices are bent or folded.

To solve the above-mentioned problems, a transparent electrode whose visible ray penetration is more than 80% and sheet resistance is less than 100 Ω/sq has been developed by minimizing light scattering and improving conductivity in the visible ray region through a process in which CNTs were dispersed in or on the surface of a coating layer at nano scale by a film of CNTs after chemically bonding it with polymers or coating purified CNTs or CNTs chemically bonded with polymers on a conductive polymer layer, and then metal nanoparticles such as gold and silver, etc., were mixed therein (KR 10-2005-001589). However, the transparent electrode has disadvantages in that it may alter inherent properties of CNTs and have polymer deformation when it is used at high temperature.

Moreover, a method for forming various wires on a plastic substrate with a general office inkjet printer using a conductive ink-jet ink having a specific resistance of 0.2 Ωcm, which is prepared by adding cut CNTs and gold nanoparticles to a solution containing aniline, a conductive polymer dissolved in isopropylalcohol (KR 10-2005-0080960), has been developed but the method has a disadvantage, in that penetration of wires and patterns printed on a substrate is poor.

Besides, although studies on using conductive polymers, which are organic materials, as a material for transparent electrodes are being conducted, most of the conductive polymers for transparent electrodes developed so far are not suitable to use for transparent electrodes since they absorb light in the visible ray region.

To solve the above mentioned problems, the present inventors have developed a method for manufacturing a transparent electrode using a high density CNT film having high purity (KR 10-2006-0032812). The above mentioned invention has an advantage in that electrical conductivity of the CNT film is improved while maintaining a visible ray penetration into the CNT film by forming metal nanoparticles on the surface of the high density CNT film formed on a substrate with covalent bonds or non-covalent bonds, by means of the electroless plating technique using an aquous solution of metal salts. However, there is a problem in that it is difficult to apply to a large-area film since the increased electrical conductivity is not uniform over the whole film.

Thus, there is an urgent need to develop a method for manufacturing a transparent electrode composed of CNT film having high visible ray penetration and excellent electrical conductivity, as well as a uniform increase in electrical conductivity over the whole CNT film.

Accordingly, the present inventors have made extensive efforts to manufacture a transparent electrode having high visible ray penetration and excellent electrical conductivity, and a uniform increase in electrical conductivity over the whole CNT film. As a result, the present inventors have found that, when a CNT film was formed on a desired substrate using a dispersed solution of CNTs and a transparent electrode is then produced by reducing metal nanoparticles on the surface of the CNT film, the produced transparent electrode showed a uniform increase in electrical conductivity, thereby completing the present invention.

SUMMARY OF THE INVENTION

It is an object of the present invention to provide a method for manufacturing a transparent electrode having high visible ray penetration and a uniformly improved electric conductivity.

It is another object of the present invention to provide a transparent electrode prepared by the method, which has metal nanoparticles formed on the surface of a high density CNT film.

To achieve the above object, the present invention provides a method for manufacturing a transparent electrode having metal nanoparticles formed on the surface of a high density CNT film, the method comprising the steps of: (a) preparing a dispersed solution of CNTs having exposed carboxyl group by dispersing the CNTs having exposed carboxyl group in a solvent to add a coupling agent, 1,3-dicyclohexyl carbodiimide (DCC) or N,N'-carbonyliimidazole (CDI) and at least one base selected from the group consisting of 1-hydroxybenzotriazole (HOBt), 2-hydroxypyridine (HOPy), endo-N-hydroxy-5-norbornene-2,3-dicarboximide (HONB), diisopropylethylamine (DIEA) and N-methylimidazole (NMI); (b) forming a single-layer CNT on the surface of a substrate through amide bond formation between the amine group and the carboxyl group by reacting a substrate having an amine group exposed on the surface thereof with the dispersed solution of CNTs having exposed carboxyl group, prepared in step (a); (c) laminating a CNT layer by reacting the dispersed solution of CNTs having exposed carboxyl group, prepared in step (a) with an organic amine layer formed on the CNT layer after reacting the single-layer CNT with an organic amine compound having at least two amine groups; (d) forming a high density CNT film having exposed carboxyl group by repeating the step (c) n times to alternately laminate CNT layers and organic amine layers n times; and (e) forming metal nanoparticles on the surface of the CNTs by immersing the high density CNT film having exposed carboxyl group in a mixture solution of water-alcohol co-solvent and metal salts.

In addition, the present invention provides a transparent electrode having metal particles on the surface of a high density CNT, which is prepared by the method.

Also, the present invention provides a method for manufacturing a transparent electrode having metal particles on the surface of a high density CNT film, the method comprising the steps of: (a) dispersing purified CNTs in an aqueous solution containing a surfactant; (b) forming a CNT film on the surface of a substrate by spraying or transferring the CNT dispersion solution to the substrate; and (c) forming metal nanoparticles on the surface of CNTs by immersing the CNT film in a mixture solution of water-alcohol co-solvent and metal salts.

Moreover, the present invention provides a transparent electrode having metal particles on the surface of a high density CNT, which is prepared by the method.

The above and other objects, features and embodiments of the present invention will be more clearly understood from the following detailed description and accompanying claims.

DETAILED DESCRIPTION OF THE INVENTION, AND PREFERRED EMBODIMENTS

The present invention, in one aspect, relates to a method for preparing a transparent electrode having metal nanoparticles formed on the surface of a high density CNT film, and a transparent electrode having metal particles formed on the surface of a high density CNT film, which is prepared by the method, the method comprising the steps of:

(a) preparing a dispersed solution of CNTs having exposed carboxyl group by dispersing the CNTs having exposed carboxyl group in a solvent to add a coupling agent, 1,3-dicyclohexyl carbodiimide (DCC) or N,N'-carbonylimidazole (CDI) and at least one base selected from the group consisting of 1-hydroxybenzotriazole (HOBt), 2-hydroxypyridine (HOPy), endo-N-hydroxy-5-norbornene-2,3-dicarboximide (HONB), diisopropylethylamine (DIEA) and N-methylimidazole (NMI);

(b) forming a single-layer CNT on the surface of a substrate through amide bond formation between the amine group and the carboxyl group by reacting a substrate having an amine group exposed on the surface thereof with the dispersed solution of CNTs having exposed carboxyl group, prepared in step (a);

(c) laminating a CNT layer by reacting the dispersed solution of CNTs having exposed carboxyl group, prepared in step (a) with an organic amine layer formed on the CNT layer after reacting the single-layer CNT with an organic amine compound having at least two amine groups;

(d) forming a high density CNT film having exposed carboxyl group by repeating the step (c) n times to alternately laminate CNT layers and organic amine layers n times; and (e) forming metal nanoparticles on the surface of the CNTs by immersing the high density CNT film having exposed carboxyl group in a mixture solution of water-alcohol co-solvent and metal salts.

In the present invention, the solvent of the step (a) is preferably one or more solvents selected from the group consisting of N-methyl-2-pyrrolidone (NMP), dimethyl acetamide (DMAc), dimethylformamide (DMF), cyclohexanone, ethylalcohol and chlorobenzene.

In the present invention, the substrate having exposed amine functional group on the surface thereof in the step (b) is preferably obtained by treating the substrate with one or more substances selected from the group consisting of aminealkyloxysilane and aminealkylchlorosilane, and the organic amine compound having two or more amine groups is preferably a substance having a chemical formula of $H_2N—R_1—NH_2$, $R_2—(NH_2)_3$ or $R_3—(NH_2)_4$; wherein $R_1$, $R_2$ and $R_3$ are independently a $C_{1-20}$ saturated hydrocarbon, unsaturated hydrocarbon, aromatic organic group or $Si_{1-20}$ silane.

In another aspect, the present invention relates to a method for preparing a transparent electrode having metal nanoparticles formed on the surface of a high density CNT film, and a transparent electrode having metal particles formed on the surface of a high density CNT film, which is prepared by the method, the method comprising the steps of:

(a) dispersing purified CNTs in an aqueous solution containing a surfactant;

(b) forming a CNT film on the surface of a substrate by spraying or transferring the CNT dispersion solution to the substrate; and (c) forming metal nanoparticles on the surface of CNTs by immersing the CNT film in a mixture solution of water-alcohol co-solvent metal salts.

In the present invention, the surfactant in the step (a) is preferably selected from the group consisting of SDS (sodium dodecyl sulfate), LDS (lithium dodecyl sulfate), SDBS (sodium dodecylbenzenesulfonate), SDSA (sodium dodecylsulfonate), DTAB (dodecyltrimethylammonium bromide), CTAB (cetyltrimethylammonium bromide), PVP (Brij-series, Tween-series, Triton X-series, poly(vinylpyrrolidone), polyethylene oxide-polybutylene oxide-polyethylene oxide triblock copolymer and polyethylene oxide-polyphenylene oxide-polyethylene oxide triblock copolymer and the CNT content dispersed in the step (a) is preferably 0.01~0.5 wt % and the surfactant content in the step (a) is preferably 0.01~2.0 wt %.

In the present invention, the substrate of the step (b) is preferably one or more materials selected from the group consisting of glass, quartz, glass wafers, silicon wafers, melted silica, plastics and transparent polymer.

In the present invention, the mixture solution of water-alcohol co-solvent and metal salts in the step (c) is an aqueous solution of metal salts whose reduction potential based on standard hydrogen electrode is preferably greater than +0.5 V. For example, the metal salt is preferably any one selected from the group consisting of hydrogen tetrachloroaurate III, sodium tetrachloroaurate III and potassium gold III chloride for forming gold nanoparticles or hydrogen hexachloroplatinate IV hydrate, hydrogen hexahydroxyplatinate IV, sodium hexachloroplatinate IV hydrate, sodium hexachloroplatinate IV hexahydrate, sodium hexahydroxyplatinate IV, potassium tetrachloroplatinate II and potassium hexachloroplatinate IV for forming paltinum nanoparticles, but it is not limited thereto.

In the present invention, the alcohol in the water-alcohol co-solvent is preferably selected from the group consisting of ethanol, methanol and ethylene glycol, and the alcohol content is 10~70% (v/v) and the concentration of metal salts in the solution is preferably 1~50 mM.

The present invention will hereinafter be described in further detail. The inventive transparent electrode composed of high purity CNT film with high density is preferably manufactured by the method comprising the following steps.

The First Step: Preparation of Cut CNT Having Exposed Carboxyl Group

CNT, used in the present invention, is not particularly limited and may be a commercially available product or prepared by a conventional method to use. To apply amide bonds to the present invention, carboxyl groups should be exposed on the surface and/or both ends of CNT and pure CNT without having impurities is needed to obtain a high purity CNT film.

The Second Step: Preparation of a Dispersed Solution of CNT Remaining in a Highly Dispersed State The prepared cut CNTs having exposed carboxyl group was put into any one or more solvents selected from the group consisting of N-methyl-2-pyrrolidone (NMP), dimethyl acetamide (DMAc), dimethylformamide (DMF), cyclohexanone, ethylalcohol and chlorobenzene to disperse in a sonicator. The obtained dispersed solution of CNTs should remain in a highly dispersed state during chemical reaction. According to the preparation method of the present invention, it is possible for the dispersed solution of CNTs to remain in a highly dispersed state when a coupling agent, DCC (1,3-dicyclohexyl carbodiimide) or CDI (N,N'-carbonyldiimidazole) and one or more bases selected from the group consisting of HOBt (1-hydroxybenzotriazole), HOPy (2-hydroxypyridine), HONB (endo-N-hydroxy-5-norbornene-2,3-dicarboximide), DIEA (diisopropylethylamine) and NMI (N-methylimiddazole) were used.

In another embodiment of the present invention, high purity CNTs are mixed in a surfactant aquous solution to disperse with a sonicator and then lumped CNTs are separated by centrifugation, thereby obtaining CNT suspension.

Herein, the surfactant may be anion surfactants such as SDS (sodium dodecyl sulfate), LDS (lithium dodecyl sulfate), SDBS (sodium dodecylbenzenesulfonate), SDSA (sodium dodecylsulfonate) and the like, cation surfactants such as DTAB (dodecyltrimethylammonium bromide), CTAB (cetyltrimethylammonium bromide) and the like, or nonpolar surfactants such as PVP (Brij-series, Tween-series, Triton X-series, poly(vinylpyrrolidone), polyethylene oxide-polybutylene oxide-polyethylene oxide triblock copolymer, polyethylene oxide-polyphenylene oxide-polyethylene oxide triblock copolymer and the like.

The Third Step: Preparation of a Substrate Having Exposed Amine Group

As a substrate of the present invention, all kinds of substrates can be used as long as it is surface-treated with amine. Also, it can be prepared by immobilizing amine allyloxysilane on the surface of a substrate to have an amine group exposed on the surface of the substrate, in which the substrate is a material selected from the group consisting of glass, quartz, glass wafers, silicon wafers, melted silica, plastics and transparent polymer and it is also possible to use commercially available substrate which had been surface-treated with amine.

The Fourth Step: Preparation of a CNT Film

The dispersed solution of CNTs having exposed carboxyl group, which remained in a highly dispersed state, prepared in the step 2, was reacted with the substrate having exposed amine group, prepared in the step 3 to form a single-layer CNT on the substrate by amide bond formation between the carboxyl group and the amine group.

Then, the single-layer CNT is reacted with an organic amine compound having two or more amine groups so as to reexpose amine group on the surface of CNT, and another CNT layer is laminated on the single-layer CNT by reacting the dispersed solution of the CNTs which remained in a highly dispersed state, prepared in the step 2, with CNTs having exposed carboxyl group.

Next, the CNT layers and the organic amine layers are alternately laminated n times by repetitively performing a chemical reaction between the CNT having exposed carboxyl group and the organic amine compound, i.e., amide bond formation to prepare a uniform CNT film having high density on the surface of the substrate.

In another embodiment, the CNT film can be prepared by a simple method in which a dispersed solution of CNTs is sprayed on the surface of a glass substrate to dry when the dispersed solution of CNTs is obtained by using the aforementioned surfactant. The CNT film could be also prepared by a method in which a dispersed solution of CNTs is filtered using an alumina filter to immerse the alumina filter having the CNT layer fixed thereon in an aqueous solution of sodium hydroxide, and then the alumina filter is removed by dissolving it to obtain CNT film, at this time the aqueous solution of sodium hydroxide was replaced with distilled water and the distilled water is completely discharged while the CNT film is fixed on a desired substrate to immobilize the CNT film on the substrate, followed by a drying process.

The Fifth Step: Forming Gold Nanoparticles

When the laminated high density CNT film prepared in the fourth step is immersed in an aqueous solution of metal ions for a given time, the metal ions are reduced to metal nanoparticles due to the difference in oxidation-reduction potential between CNTs and metal ions to form metal nanoparticles on the surface of CNTs.

As the metal salts that can be used for the above reaction, any one selected from the group consisting of hydrogen tetrachloroaurate III, sodium tetrachloroaurate III and potassium gold III chloride can be used for forming gold nanoparticles and any one selected from the group consisting of hydrogen hexachloroplatinate IV hydrate, hydrogen hexahydroxyplatinate IV, sodium hexachloroplatinate IV hydrate, sodium hexachloroplatinate IV hexahydrate, sodium hexahydroxyplatinate IV, potassium tetrachloroplatinate II and potassium hexachloroplatinate IV can be used for forming paltinum nanoparticles. In addition to the materials, metal salts whose reducing potential is more than +0.5V based on standard hydrogen electrode can be used without limitation. At this time, as the solvent that can be used, it is preferable to use by mixing 10~70% (v/v) alcohol such as ethanol, methanol, ethylene glycol and the like with distillated water. If the alcohol is mixed at a volume ratio of less than 10%, metal particles may not be easily formed and if the alcohol is mixed at a volume ratio of more than 70%, metal particles may be formed separately without being fixed on the surface of CNTs, so that it is hard to achieve the desired properties of materials which was intended for the present invention.

In the present invention, the substrate can be used without limitation as long as it is a material such as glass, quartz, glass wafers, silicon wafers, melted silica, plastics and transparent polymer, which has transparency and, on which CNT layer can be formed. By using the above method, a high density, transparent, CNT electrode, which has an excellent visible ray penetration and low surface resistance, can be manufactured.

EXAMPLE

Hereinafter, the present invention will be described in more detail by examples. It is to be understood, however, that these examples are for illustrative purpose only and are not construded to limit the scope of the present invention.

Example 1: Preparation of Cut CNT Having Exposed Carboxyl Group 500 mg of CNT was heat-treated in a furnace with a temperature of 365° C. for 1 hour while air is injected at a flow of 0.1 SLM (Standard Liter per Minute). The heat-treated CNT was put into 1 L HCl to purify in a sonicator for 3 hours and filtered through a 1 μm filter to dry, then the above-described process was repeated 5 times. In order to cut the purified CNT into CNTs having exposed carboxyl group, the purified CNT was stirred in a mixture solution of $H_2SO_4$ and $H_2O_2$ (a volume ratio of 4:1) for 24 hours, then cut and diluted in a distilled water. The obtained suspension of CNTs was filtered through a 0.2 μm filter and dried.

Example 2: Preparation of a Dispersed Solution of CNTs Remaining in a Highly Dispersed State 0.1 wt % of cut CNTs having exposed carboxyl group, prepared in Example 1, was put into dimethylformamide (DMF) solvent to disperse in a sonicator for 10 hours, DCC (1,3-dicyclohexylcarbodiimide) as an amide coupling agent and HOBt (1-hydroxybenzotriazole) as base were dissolved in the CNT-dispersed solvent at a concentration of 12 mM.

Example 3: Preparation of Substrate Having Exposed Amine Group

A glass substrate was put into a toluene solution of 0.2% (v/v) aminealkyloxysilane and allowed it to react for 1 hour at room temperature, then washed by soaking in a toluene solution 3 times, followed by drying in a vacuum oven for 20 minute at 120° C. to prepare a glass substrate having exposed amine group.

Example 4: Preparation of CNT Film

The glass substrate having exposed amine group, prepared in Example 3, was allowed to react with the dispersed solution of CNTs remaining in a highly dispersed state, prepared in Example 2 to form a single-layer CNT on a substrate by amide bond formation between the amine group and the carboxyl group.

Then, 0.1 M of oxydianyline as an organic amine compound was dissolved in dimethylformamaid (DMF) solvent, and the CNT layer fixed on the substrate was put into the resulting solution, and then allowed to react for 10 hours at room temperature to reexpose an amine group on the surface of CNT through a washing process using dimethylformamaid (DMF) and dichloromethane. The glass substrate having another side of exposed amine group, provided by the organic amine compound was put into the dispersed solution of CNTs, prepared in Example 2 and allowed to react for 10 hours at room temperature, and then washed using dimethylformamaid (DMF) and dichloromethane to laminate another CNT layer on primarily formed single-layer CNT.

Figure 1:
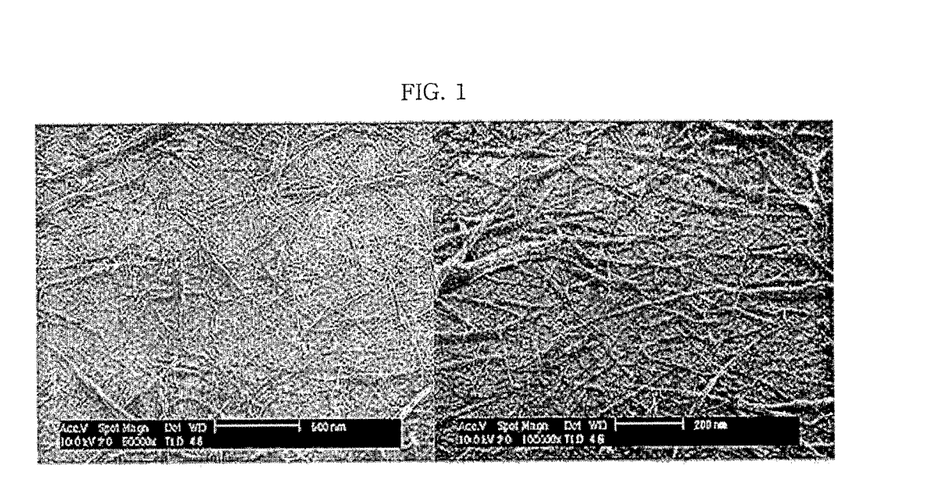
FIG. 1 is scanning electronic microscopy images of the surface of a substrate having a high purity CNT film with high density, formed by laminating CNTs 5 times (left: magnification 50,000×, right: magnification 100,000×).

Next, chemical reaction between CNT having exposed carboxyl group and an organic amine compound, i. e., amide bond formation was repetitively performed, and then the CNT layers and the organic amide layers are alternately laminated n times which is as many as the number of amide bonds to prepare a high density CNT film with uniform surface. FIG. 1 is scanning electronic microscopy images of CNT film fixed on the surface of a substrate after laminating CNTs 5 times (left: magnification 50,000×, right: magnification 100,000×). As shown in FIG. 1, it could be seen that the CNT film prepared by the above method has uniformly formed CNTs with high density.

Example 5: Forming Gold Nanoparticles on a Surface of CNT Film

Figure 2:
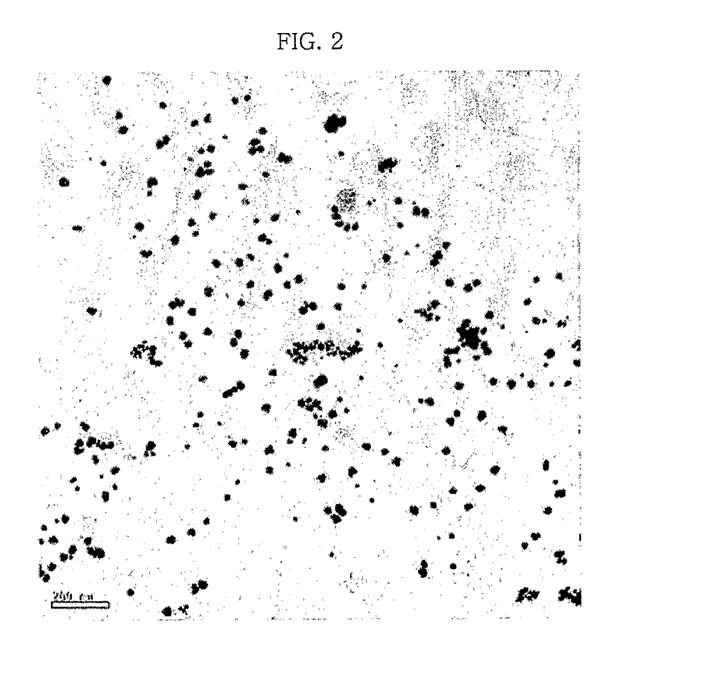
FIG. 2 shows a transmission electron microscope image of the CNT film having gold nanoparticles on the surface thereof.

The multilayer CNT film formed on the glass substrate in the example 4 was immersed into a solution of 5 mM hydrogen tetrarchloroaurate III dissolved in a solvent mixed at a 1:1 volume ratio (distilled water:ethanol) at room temperature, for 10 minutes to sufficiently wash with distilled water, and dried under argon atmosphere at room temperature, followed by forming gold nanoparticles on the surface of the film, thus preparing a transparent electrode having gold nanoparticles on the surface thereof. FIG. 2 shows a transmission electron microscope image of the gold nanoparticles. As shown in FIG. 2, it could be found that the CNT film prepared according to the above method had the gold nanoparticles formed uniformly on the surface thereof.

Figure 3:
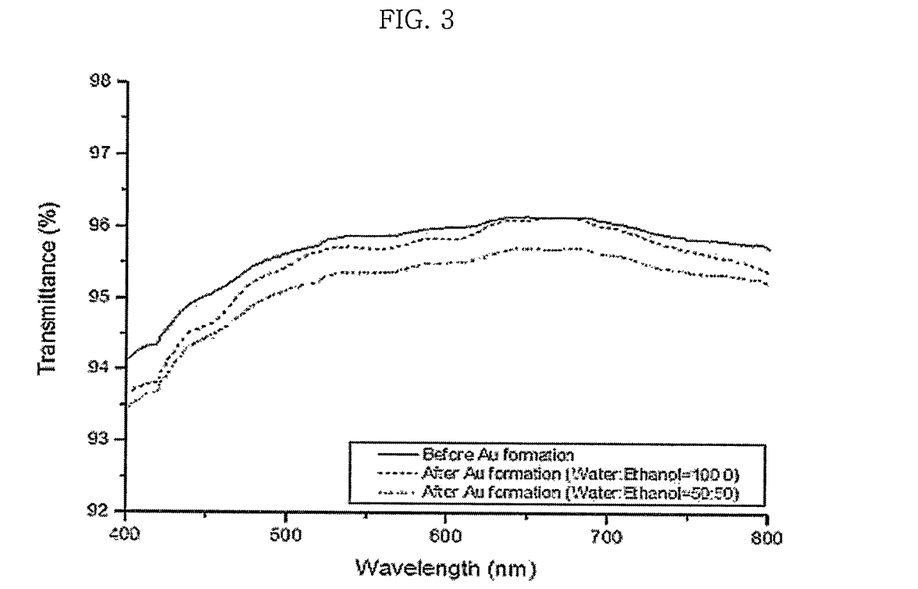
FIG. 3 and FIG. 4 are UV-vis-NIR (near infrared ray) spectrophotometer graphs showing changes in penetration before and after forming gold nanoparticles on the surface of CNT film.
Figure 5:
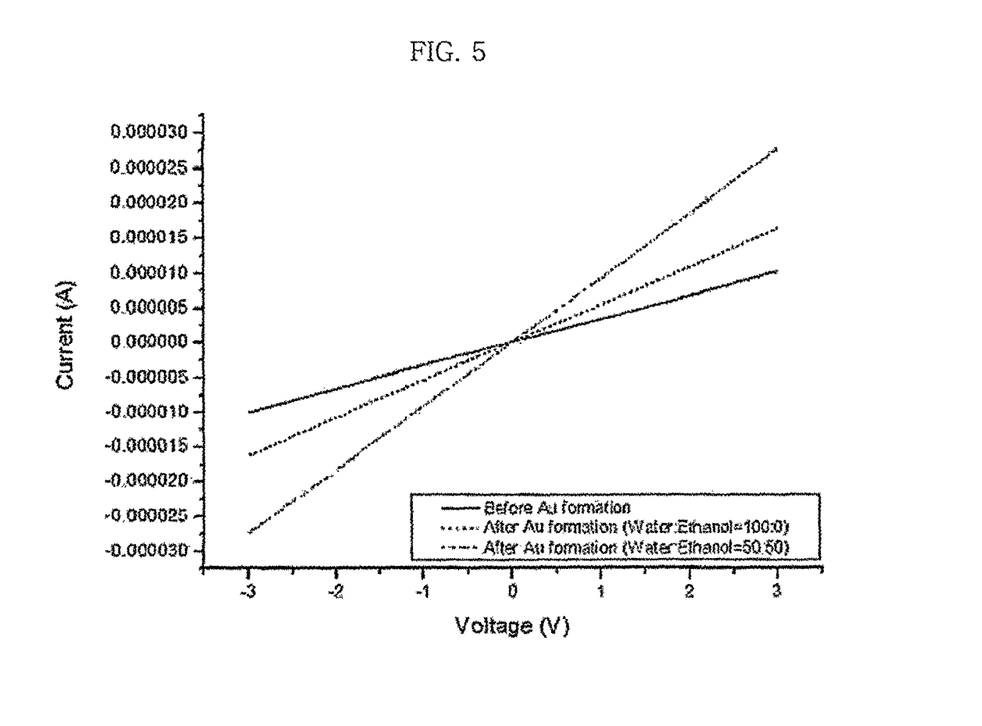
FIG. 5 and FIG. 6 show current-voltage graphs showing changes in electrical conductivity before and after forming gold nanoparticles on the surface of CNT film.

As a result of measuring a visible ray penetration of the transparent electrode using UW-vis-NIR spectrophotometer, as shown in FIG. 3, the transparent electrode according to the present invention showed more than 90% penetration. In addition, as a result of measuring random 5 sites in the sample using a current-voltage measurement device and comparing the mean value of the electrical conductivities of the transparent electrode, as shown in FIG. 5, it could be seen that the electrical conductivity of the transparent electrode after the gold nanoparticles are formed, i.e the slope of current-voltage measurements, showed a uniform, 3 folds increase compared to that before the gold nanoparticles are formed.

Example 6: Preparation of a Transparent Electrode Using Surfactants 1 mg/ml uncut high purity CNT in example 1, was mixed in an aqueous solution of 1% SDS (sodium dodecyl sulfate) to disperse for 10 hours using sonicator. Lumped CNTs were separated by centrifugation to obtain CNT suspension having a high degree of dispersion.

The CNT dispersed solution was sprayed on the surface of a glass substrate, then dried at 100° C., followed by sufficiently washing with distilled water to remove surfactants contained in a film. The glass substrate having a multilayer CNT film formed thereon was immersed into a solution of 5 mM hydrogen tetrarchloroaurate III dissolved in a solvent mixed at 1:1 volume ratio (distilled water:ethanol) at room temperature, for 10 minutes to sufficiently wash with distilled water, and dried under argon atmosphere at room temperature, followed by forming gold nanoparticles on the surface of the film, thus preparing a transparent electrode having gold nanoparticles on the surface thereof.

Figure 4:
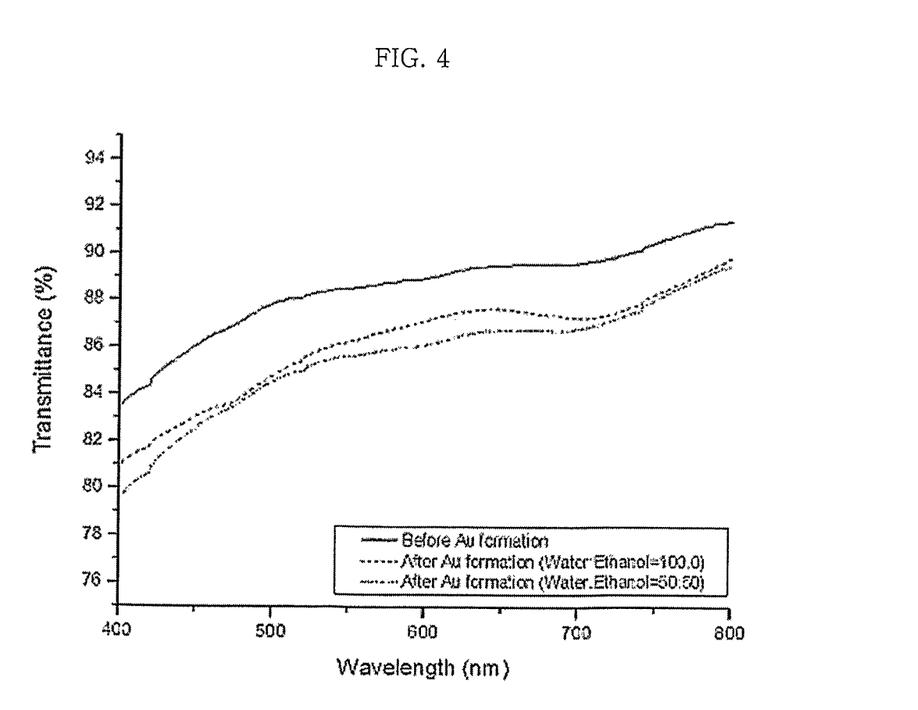
Figure 6:
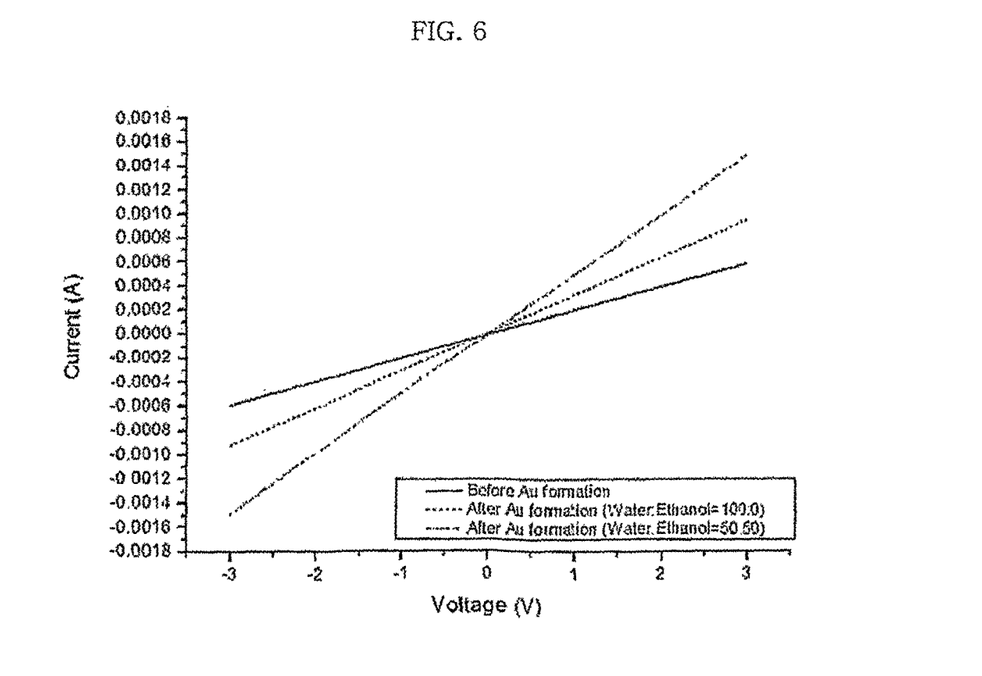

As a result of measuring a visible ray penetration of the transparent electrode using UW-vis-NIR spectrophotometer, as shown in FIG. 4, the transparent electrode according to the present invention showed more than 80% penetration. In addition, as a result of measuring random 5 sites in the sample using a current-voltage measurement device and comparing the mean value of the electrical conductivities of the transparent electrode, as shown in FIG. 6, it could be seen that the electrical conductivity of the transparent electrode after the gold nanoparticles are formed, i.e the slope of current-voltage measurements, showed a uniform, 2.5 folds increase compared to that before the gold nanoparticles are formed.

Comparative Example 1: Forming Gold Nanoparticles on a Surface of CNT Film

The multilayer CNT film formed on a glass substrate in the example 4 was immersed into a solution of 5 mM hydrogen tetrarchloroaurate III dissolved in a solvent containing only distilled water for 10 minutes to sufficiently wash with distilled water, and dried under argon atmosphere at room temperature, followed by forming gold nanoparticles on the surface of the film, thus preparing a transparent electrode having gold nanoparticles on the surface thereof.

As a result of measuring a visible ray penetration of the transparent electrode using UW-vis-NIR spectrophotometer, as shown in FIG. 3, the transparent electrode according to the present invention showed more than 90% penetration. In addition, as a result of measuring random 5 sites in the sample using a current-voltage measurement device and comparing the mean value of the electrical conductivities of the transparent electrode, as shown in FIG. 5, it could be seen that the electrical conductivity of the transparent electrode after the gold nanoparticles are formed, i.e the slope of current-voltage measurements, showed 1.5 folds increase compared to that before the gold nanoparticles are formed. However, it could be seen that the maximum deviation among the measurements in the 5 sites reached up to 50%, and the gold nanoparticles were not uniformly formed.

Comparative Example 2: Preparation of a Transparent Electrode Using Surfactants 1 mg/ml of uncut high purity CNT in example 1, was mixed in an aqueous solution of 1% SDS (sodium dodecyl sulfate) to disperse for 10 hours using sonicator. Lumped CNTs were separated by centrifugation to obtain CNT suspension having a high degree of dispersion.

The CNT dispersed solution was sprayed on the surface of a glass substrate, then dried at 100° C., followed by sufficiently washing with distilled water to remove surfactants contained in a film. The glass substrate having a multilayer CNT film formed thereon was immersed into a solution of 5 mM hydrogen tetrarchloroaurate III dissolved in a solvent containing only distilled water for 10 minutes to sufficiently wash with distilled water, and dried under argon atmosphere at room temperature, followed by forming gold nanoparticles on the surface of the film, thus preparing a transparent electrode having gold nanoparticles on the surface thereof.

As a result of measuring a visible ray penetration of the transparent electrode using UW-vis-NIR spectrophotometer, the transparent electrode according to the present invention showed more than 80% penetration. In addition, as a result of measuring random 5 sites in the sample using a current-voltage measurement device and comparing the mean value of the electrical conductivities of the transparent electrode, as shown in FIG. 6, it could be seen that the electrical conductivity of the transparent electrode after the gold nanoparticles are formed, i.e the slope of current-voltage measurements, showed 1.5 folds increase compared to that before the gold nanoparticles are formed. However, it could be seen that the maximum deviation among the measurements in the 5 sites reached up to 50%, and the gold nanoparticles were not uniformly formed.

INDUSTRIAL APPLICABILITY

As described above, according to the present invention, a transparent electrode in which gold nanoparticles are formed on the surface of high density CNT film having high purity, can be prepared. The transparent electrode has high visible ray penetration and an excellent electrical conductivity by hyperfine metal particles uniformly formed on the surface thereof as well as a uniform increase in electrical conductivity over the whole CNT film, and thus it can be applied to various displays as well as image sensors, solar cells, touch panels, digital papers, electromagnetic shielding agents, static charge preventing agents and the like.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. A method for preparing a transparent electrode having gold nanoparticles formed on the surface of a CNT (carbon nanotube) film, the method comprising:
   (a) preparing a suspension of uncut CNTs by mixing the CNTs with a surfactant;
   (b) spraying the suspension of CNTs on a surface of a substrate and drying to form a multi-layer CNT film thereon; and
   (c) forming gold nanoparticles on the surface of the CNTs by immersing the multi-layer CNT film in a mixture solution of water-alcohol co-solvent and gold-containing salts wherein gold ions in the gold-containing salts are reduced to gold nanoparticles at room temperature due to the difference in oxidation-reduction potential between the CNTs and the gold ions to form the gold nanoparticles on the surface of the CNTs.

2. The method according to claim 1, wherein the surfactant is selected from the group consisting of SDS (sodium dodecyl sulfate), LDS (lithium dodecyl sulfate), SDBS (sodium dodecylbenzenesulfonate), SDSA (sodium dodecylsulfonate), DTAB (dodecyltrimethylammonium bromide), CTAB (cetyltrimethylammonium bromide), PVP (poly(vinylpyrrolidone), polyethylene oxide-polybutylene oxide-polyethylene oxide triblock copolymer, and polyethylene oxide-polyphenylene oxide-polyethylene oxide triblock copolymer.

3. The method according to claim 1, wherein the mixture solution of water-alcohol co-solvent and gold-containing salts is an aqueous solution of gold-containing salts whose reduction potential based on standard hydrogen electrode is greater than +0.5 V.

4. The method according to claim 1, wherein the gold-containing salt is any one selected from the group consisting of hydrogen tetrachloroaurate sodium tetrachloroaurate III and potassium gold III chloride for forming gold nanoparticles.

5. The method according to claim 1, wherein the alcohol in the water-alcohol co-solvent is selected from the group consisting of ethanol, methanol and ethylene glycol, and the alcohol is used by mixing 10~70% (v/v) alcohol with distilled water.

6. The method according to claim 1, wherein the transparent electrode has a visible ray penetration more than 80%.

7. The method according to claim 1, wherein the transparent electrode has a sheet resistance less than 100 Ω/sq.

* * * * *